United States Patent
Bjelopavlic et al.

(10) Patent No.: US 11,820,929 B2
(45) Date of Patent: *Nov. 21, 2023

(54) ETCHING COMPOSITIONS

(71) Applicant: Fujifilm Electronic Materials U.S.A., Inc., N. Kingstown, RI (US)

(72) Inventors: Mick Bjelopavlic, Chandler, AZ (US); Carl Ballesteros, San Tan Valley, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/466,531

(22) Filed: Sep. 3, 2021

(65) Prior Publication Data

US 2022/0081616 A1  Mar. 17, 2022

Related U.S. Application Data

(60) Provisional application No. 63/077,283, filed on Sep. 11, 2020.

(51) Int. Cl.
| | |
|---|---|
| *C09K 13/08* | (2006.01) |
| *C09K 13/06* | (2006.01) |
| *B01J 27/16* | (2006.01) |
| *B01J 27/02* | (2006.01) |
| *H01L 21/02* | (2006.01) |

(52) U.S. Cl.
CPC .............. *C09K 13/08* (2013.01); *B01J 27/02* (2013.01); *B01J 27/16* (2013.01); *C09K 13/06* (2013.01); *H01L 21/02019* (2013.01)

(58) Field of Classification Search
CPC .......... C09K 13/08; C09K 13/06; B01J 27/02; B01J 27/16; H01L 21/02019; H01L 21/30604

USPC ................................. 257/79.1–79.4
See application file for complete search history.

(56) References Cited

U.S. PATENT DOCUMENTS

| | | | |
|---|---|---|---|
| 10,920,144 B2* | 2/2021 | Bjelopavlic | C09K 13/10 |
| 11,124,704 B2* | 9/2021 | Bjelopavlic | H01L 21/30604 |
| 2008/0173328 A1* | 7/2008 | Nishiwaki | C11D 3/3707 |
| | | | 134/6 |
| 2013/0109191 A1 | 5/2013 | Le Tiec et al. | |
| 2018/0163130 A1 | 6/2018 | Kim et al. | |
| 2018/0277379 A1 | 9/2018 | Dictus et al. | |
| 2018/0294165 A1 | 10/2018 | Bilodeau | |
| 2019/0103282 A1 | 4/2019 | Ge et al. | |
| 2020/0079999 A1* | 3/2020 | Kim | H01L 29/0653 |
| 2020/0172808 A1* | 6/2020 | Bjelopavlic | H01L 21/32134 |
| 2020/0211856 A1* | 7/2020 | Wada | H01L 21/30604 |
| 2021/0214612 A1* | 7/2021 | Bjelopavlic | H01L 21/32134 |

FOREIGN PATENT DOCUMENTS

| | | | | |
|---|---|---|---|---|
| CN | 1677248 | * | 5/2005 | G03F 7/42 |
| WO | WO-2017126554 A1 | * | 7/2017 | C11D 11/0047 |

OTHER PUBLICATIONS

Yan-Min (Naphthalene Sulfonic Acid Formaldehyde condensate) (Year: 2019).*
International Search Report and Written Opinion issued in International Application No. PCT/US2021/049092, dated Dec. 13, 2021.

* cited by examiner

*Primary Examiner* — Duy Vu N Deo
(74) *Attorney, Agent, or Firm* — Fish & Richardson P.C.

(57) ABSTRACT

The present disclosure is directed to etching compositions that are useful for, e.g., selectively removing silicon germanium (SiGe) from a semiconductor substrate as an intermediate step in a multistep semiconductor manufacturing process.

70 Claims, No Drawings

ETCHING COMPOSITIONS

CROSS-REFERENCE TO RELATED APPLICATION

The present application claims priority to U.S. Provisional Application Ser. No. 63/077,283, filed on Sep. 11, 2020, the contents of which are hereby incorporated by reference in their entirety.

FIELD OF THE DISCLOSURE

The present disclosure relates to etching compositions and processes of using etching compositions. In particular, the present disclosure relates to etching compositions that can selectively etch silicon germanium in the presence of other exposed or underlying materials, such as metal conductors (e.g., copper), barrier materials, insulator materials (e.g., low-k dielectric materials).

BACKGROUND OF THE DISCLOSURE

The semiconductor industry is rapidly decreasing the dimensions and increasing the density of electronic circuitry and electronic components in microelectronic devices, silicon chips, liquid crystal displays, MEMS (Micro Electro Mechanical Systems), printed wiring boards, and the like. The integrated circuits within them are being layered or stacked with constantly decreasing thicknesses of the insulating layer between each circuitry layer and smaller and smaller feature sizes. As the feature sizes have shrunk, patterns have become smaller, and device performance parameters tighter and more robust. As a result, various issues which heretofore could be tolerated, can no longer be tolerated or have become more of an issue due to the smaller feature size.

In the production of advanced integrated circuits, to minimize problems associated with the higher density and to optimize performance, both high k and low k insulators, and assorted barrier layer materials have been employed.

Silicon germanium (SiGe) can be utilized in the manufacturing of semiconductor devices, liquid crystal displays, MEMS (Micro Electro Mechanical Systems), printed wiring boards and the like, as nanowires and/or nanosheets. For example, it can be used as a gate material in a multigate device, such as a multiple-gate field-effect transistor (FET) (e.g., a gate-all-around FET).

SUMMARY OF THE DISCLOSURE

In the construction of semiconductor devices, silicon germanium (SiGe) frequently needs to be etched. In the various types of uses and device environments of SiGe, other layers are in contact with or otherwise exposed at the same time as this material is etched. Highly selective etching of the SiGe in the presence of these other materials (e.g. metal conductors, dielectric, and hard marks) is typically needed for device yield and long life. The etching process for the SiGe may be a plasma etching process. However, using a plasma etching process on the SiGe layer may cause damage to either or both the gate insulating layer and the semiconductor substrate. In addition, the etching process may remove a portion of the semiconductor substrate by etching the gate insulating layer exposed by the gate electrode. The electrical characteristics of the transistor may be negatively impacted. To avoid such etching damage, additional protective device manufacturing steps may be employed, but at a significant cost.

The present disclosure relates to compositions and processes for selectively etching SiGe relative to hard mask layers, gate materials (e.g., SiN, poly-Si, or SiOx) and low-k dielectric layers (e.g., boron doped SiGe, SiN, poly-Si, SiOx, carbon doped oxide, or SiCO) that are present in the semiconductor device. More specifically, the present disclosure relates to compositions and processes for selectively etching SiGe relative to low-k dielectric layers, such as boron doped SiGe, which can enhance carrier mobility.

In one aspect, the disclosure features an etching composition that includes (1) at least one fluorine-containing acid, the at least one fluorine-containing acid containing hydrofluoric acid or hexafluorosilicic acid; (2) at least one oxidizing agent; (3) at least one inorganic acid different from the fluorine-containing acid; (4) at least one organic acid or an anhydride thereof, the at least one organic acid comprising formic acid, acetic acid, propionic acid, or butyric acid; (5) at least one polymerized naphthalene sulfonic acid; and (6) at least one amine, the at least one amine comprising an amine of formula (I): N—$R_1R_2R_3$, wherein $R_1$ is $C_1$-$C_8$ alkyl optionally substituted by OH or $NH_2$, $R_2$ is H or $C_1$-$C_8$ alkyl optionally substituted by OH, and $R_3$ is $C_1$-$C_8$ alkyl optionally substituted by OH.

In another aspect, the disclosure features an etching composition that includes (1) at least one fluorine-containing acid, the at least one fluorine-containing acid containing hydrofluoric acid or hexafluorosilicic acid; (2) at least one oxidizing agent; (3) at least one organic acid or an anhydride thereof, the at least one organic acid containing formic acid, acetic acid, propionic acid, or butyric acid; (4) at least one polymerized naphthalene sulfonic acid or a salt thereof; (5) at least one amine, the at least one amine comprising an amine of formula (I): N—$R_1R_2R_3$, wherein $R_1$ is $C_1$-$C_8$ alkyl optionally substituted by OH or $NH_2$, $R_2$ is H or $C_1$-$C_8$ alkyl optionally substituted by OH, and $R_3$ is $C_1$-$C_8$ alkyl optionally substituted by OH; and (6) at least one glycol.

In another aspect, the disclosure features a method that includes contacting a semiconductor substrate containing a SiGe film with an etching composition described herein to remove the SiGe film.

In still another aspect, the disclosure features an article formed by the method described above, in which the article is a semiconductor device (e.g., an integrated circuit).

DETAILED DESCRIPTION OF THE DISCLOSURE

As defined herein, unless otherwise noted, all percentages expressed should be understood to be percentages by weight to the total weight of the composition.

In general, the disclosure features an etching composition (e.g., an etching composition for selectively removing SiGe) that includes (1) at least one fluorine-containing acid, the at least one fluorine-containing acid containing hydrofluoric acid or hexafluorosilicic acid; (2) at least one oxidizing agent; (3) at least one inorganic acid different from the fluorine-containing acid; (4) at least one organic acid or an anhydride thereof, the at least one organic acid comprising formic acid, acetic acid, propionic acid, or butyric acid; (5) at least one polymerized naphthalene sulfonic acid; (6) at least one pyridine containing compound; and (7) at least one amine, the at least one amine comprising an amine of formula (I): N—$R_1R_2R_3$, wherein $R_1$ is $C_1$-$C_8$ alkyl optionally substituted by OH or $NH_2$, $R_2$ is H or $C_1$-$C_8$ alkyl optionally substituted by OH, and $R_3$ is $C_1$-$C_8$ alkyl optionally substituted by OH.

In some embodiments, the etching composition of this disclosure can include at least one (e.g., two, three, or four) fluorine-containing acid. The fluorine-containing acid described herein can be an inorganic acid, such as HF or $H_2SiF_6$. In some embodiments, the at least one fluorine-containing acid is in an amount of at least about 0.01 wt % (e.g., at least about 0.02 wt %, at least about 0.04 wt %, at least about 0.05 wt %, at least about 0.06 wt %, at least about 0.08 wt %, at least about 0.1 wt %, at least about 0.2 wt %, at least about 0.4 wt %, at least about 0.5 wt %, at least about 0.6 wt %, at least about 0.8 wt %, at least about 1 wt %, at least about 1.2 wt %, at least about 1.4 wt %, or at least about 1.5 wt %) to at most about 2 wt % (e.g., at most about 1.9 wt %, at most about 1.8 wt %, at most about 1.7 wt %, at most about 1.6 wt %, at most about 1.5 wt %, at most about 1.2 wt %, at most about 1 wt %, or at most about 0.5 wt %) of the etching composition of this disclosure. Without wishing to be bound by theory, it is believed that fluorine-containing acid can facilitate and enhance the removal of SiGe on a semiconductor substrate during the etching process. On the other hand, the fluorine-containing acid also increases the removal of certain dielectric materials (e.g., SiOx and boron doped SiGe) and therefore its amount in the etch compositions described herein preferably should be limited if it is desirable to minimize the removal of such dielectric materials.

In some embodiments, the etching composition of this disclosure can include at least one (e.g., two, three, or four) oxidizing agent suitable for use in microelectronic applications. Examples of suitable oxidizing agents include oxidizing acids (e.g., nitric acid, permanganic acid, or potassium permanganate) and salts thereof, peroxides (e.g., hydrogen peroxide, dialkylperoxides, or urea hydrogen peroxide), persulfonic acid (e.g., hexafluoropropanepersulfonic acid, methanepersulfonic acid, trifluoromethanepersulfonic acid, or p-toluenepersulfonic acid) and salts thereof, ozone, peroxycarboxylic acids (e.g., peracetic acid) and salts thereof, perphosphoric acid and salts thereof, persulfuric acid and salts thereof (e.g., ammonium persulfate or tetramethylammonium persulfate), perchloric acid and salts thereof (e.g., ammonium perchlorate, sodium perchlorate, or tetramethylammonium perchlorate), and periodic acid and salts thereof (e.g., periodic acid, ammonium periodate, or tetramethylammonium periodate). These oxidizing agents can be used singly or in combination.

In some embodiments, the at least one oxidizing agent can be from at least about 5 wt % (e.g., at least about 6 wt %, at least about 7 wt %, at least about 8 wt %, at least about 9 wt %, at least about 10 wt %, at least about 11 wt %, at least about 13 wt %, or at least about 15 wt %) to at most about 20 wt % (e.g., at most about 18 wt %, at most about 16 wt %, at most about 15 wt %, at most about 14 wt %, at most about 12 wt %, or at most about 10 wt %) of the etching composition of this disclosure. Without wishing to be bound by theory, it is believed that the oxidizing agent can facilitate and enhance the removal of SiGe on a semiconductor substrate.

In some embodiments, the etching composition of this disclosure can optionally include at least one (e.g., two, three, or four) catalyst. In some embodiments, the catalyst can be an acid different from the fluorine-containing acid. For example, the catalyst can be an acid that does not contain fluorine. Examples of suitable catalysts include sulfuric acid ($H_2SO_4$), sulfonic acids, and phosphonic acids.

Examples of suitable sulfonic acids include alkylsulfonic acids (including substituted or unsubstituted alkylsulfonic acid) and arylsulfonic acids (including substituted or unsubstituted arylsulfonic acid). Examples of suitable alkylsulfonic acids include methanesulfonic acid, trifluoromethanesulfonic acid (or triflic acid), and 2-hydroxyethanesulfonic acid (or isethionic acid). Examples of suitable arylsulfonic acids include p-toluenesulfonic acid and naphthalene sulfonic acid.

Examples of suitable phosphonic acids include those of formula (II):

$$R\text{---}PO(OH)_2 \qquad (II),$$

in which R is H, $C_1$-$C_{10}$ alkyl, or aryl. Examples of suitable phosphonic acids include unsubstituted phosphonic acid ($H_3PO_3$) and phenylphosphonic acid.

Without wishing to be bound by theory, it is believed that including a catalyst into the etching composition described herein can increase the rate of formation of a peracid (such as peracetic acid), which together with the fluorine-containing acid, can enhance SiGe removal. It is also believed that the catalyst can significantly inhibit the removal of certain dielectric materials (e.g., SiOx) in the semiconductor substrate during the etching process.

In some embodiments, the at least one catalyst is in an amount of at least about 0.1 wt % (e.g., at least about 0.2 wt %, at least about 0.4 wt %, at least about 0.5 wt %, at least about 0.6 wt %, at least about 0.8 wt %, at least about 1 wt %, at least about 1.2 wt %, at least about 1.4 wt %, or at least about 1.5 wt %) to at most about 5 wt % (e.g., at most about 4.5 wt %, at most about 4 wt %, at most about 3.5 wt %, at most about 3 wt %, at most about 2.5 wt %, at most about 2 wt %, at most about 1.5 wt %, or at most about 1 wt %) of the etching composition of this disclosure. In some embodiments, the at least one catalyst can be omitted from the etching composition of this disclosure (e.g., when the etching composition includes a glycol).

In some embodiments, the etching composition of this disclosure can include at least one (e.g., two, three, or four) organic acid or an anhydride thereof. In some embodiments, the organic acid can be formic acid, acetic acid, propionic acid, or butyric acid. In some embodiments, the organic acid anhydride can be formic anhydride, acetic anhydride, propionic anhydride, or butyric anhydride. In some embodiments, the etching composition can include both an organic acid and an anhydride (e.g., the anhydride of the organic acid). Without wishing to be bound by theory, it is believed that the organic acid or an anhydride thereof can facilitate and enhance the removal of SiGe on a semiconductor substrate.

In some embodiments, the at least one organic acid or an anhydride thereof can be from at least about 30 wt % (e.g., at least about 35 wt %, at least about 40 wt %, at least about 45 wt %, at least about 50 wt %, at least about 55 wt %, or at least about 60 wt %) to at most about 90 wt % (e.g., at most about 85 wt %, at most about 80 wt %, at most about 75 wt %, at most about 70 wt %, at most about 65 wt %, at most about 60 wt %, at most about 55 wt %, at most about 50 wt %, at most about 45 wt %, or at most about 40 wt %) of the etching composition of this disclosure.

In some embodiments, the etching composition of this disclosure can include at least one polymerized naphthalene sulfonic acid (or poly(naphthalene sulfonic acid)) or a salt thereof, e.g., as a surfactant or selective inhibitor. In some embodiments, the polymerized naphthalene sulfonic acid can be a sulfonic acid having the following chemical structure:

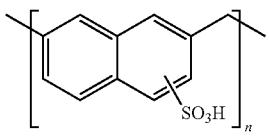

in which n is 3, 4, 5, or 6. Commercially available examples of such the polymerized naphthalene sulfonic acids include Takesurf A-47 series products available from Takemoto Oil & Fat Co., Ltd. Without wishing to be bound by theory, it is believed that the polymerized naphthalene sulfonic acid or a salt thereof can selectively inhibit the removal of SiN, poly-Si, and SiCO when SiGe is removed from a semiconductor substrate using the etching composition of this disclosure.

In some embodiments, the at least one polymerized naphthalene sulfonic acid or a salt thereof can be from at least about 0.001 wt % (e.g., at least about 0.005 wt %, at least about 0.01 wt %, at least about 0.02 wt %, at least about 0.03 wt %, at least about 0.04 wt %, at least about 0.05 wt %, or at least about 0.1 wt %) to at most about 0.15 wt % (e.g., at most about 0.14 wt %, at most about 0.12 wt %, at most about 0.1 wt %, at most about 0.08 wt %, at most about 0.06 wt %, at most about 0.05 wt %, or at most about 0.02 wt %) of the etching composition of this disclosure.

In some embodiments, the etching composition of this disclosure can optionally include at least one (e.g., two, three, or four) pyridine containing compound. For example, the pyridine containing compound can include pyridine optionally substituted by $C_1$-$C_6$ alkyl (e.g., methyl or ethyl), a pyridine containing acid, a pyridine containing alcohol, or a salt thereof (e.g., a HCl salt thereof). Examples of suitable pyridine containing compound include picolinic acid, dipicolinic acid, nicotinic acid, isonicotinic acid, 2-amino-isonicotinic acid, isonicotinic acid N-oxide, 4-pyridylacetic acid, 3-pyridylacetic acid, 2-pyridylacetic acid, 4-pyridinepropanol, 3-pyridinepropanol, 2-methylpyridine, 3-methylpyridine, and a salt thereof (e.g., a HCl salt of an acid). Without wishing to be bound by theory, it is believed that the pyridine containing compound can selectively inhibit the removal of boron doped SiGe (which is needed for improved carrier mobility) when SiGe is removed from a semiconductor substrate using the etching composition of this disclosure.

In some embodiments, the at least one pyridine containing compound is in an amount of at least about 0.01 wt % (e.g., at least about 0.02 wt %, at least about 0.04 wt %, at least about 0.05 wt %, at least about 0.06 wt %, at least about 0.08 wt %, at least about 0.1 wt %, at least about 0.2 wt %, at least about 0.3 wt %, at least about 0.4 wt %, or at least about 0.5 wt %) to at most about 1 wt % (e.g., at most about 0.9 wt %, at most about 0.8 wt %, at most about 0.7 wt %, at most about 0.6 wt %, at most about 0.5 wt %, at most about 0.4 wt %, at most about 0.2 wt %, or at most about 0.1 wt %) of the etching composition of this disclosure.

In some embodiments, the etching composition of this disclosure can include at least one (e.g., two, three, or four) amine. In some embodiments, the amine can be an amine of formula (I): N—$R_1R_2R_3$, wherein $R_1$ is $C_1$-$C_8$ alkyl optionally substituted by OH or $NH_2$, $R_2$ is H or $C_1$-$C_8$ alkyl optionally substituted by OH, and $R_3$ is $C_1$-$C_8$ alkyl optionally substituted by OH. Examples of suitable amines of formula (I) include diisopropylamine, N-butyldiethanolamine, N-(3-aminopropyl)-diethanolamine, N-octylglucamine, N-ethylglucamine, N-methylglucamine, and 1-[bis (2-hydroxyethyl)amino]-2-propanol. Without wishing to be bound by theory, it is believed that the amine can selectively inhibit the removal of SiN, poly-Si, and SiCO when SiGe is removed from a semiconductor substrate using the etching composition of this disclosure.

In some embodiments, the at least one amine can be from at least about 0.001 wt % (e.g., at least about 0.002 wt %, at least about 0.005 wt %, at least about 0.008 wt %, at least about 0.01 wt %, at least about 0.02 wt %, at least about 0.05 wt %, or at least about 0.1 wt %) to at most about 0.15 wt % (e.g., at most about 0.14 wt %, at most about 0.12 wt %, at most about 0.1 wt %, at most about 0.08 wt %, at most about 0.06 wt %, or at most about 0.05 wt %) of the etching composition of this disclosure.

In some embodiments, the etching composition of this disclosure can include water as a solvent. In some embodiments, the water can be de-ionized and ultra-pure, contain no organic contaminants and have a minimum resistivity of about 4 to about 17 mega Ohms, or at least about 17 mega Ohms. In some embodiments, the water is in an amount of from at least about 10 wt % (e.g., at least about 15 wt %, at least about 20 wt %, at least about 25 wt %, at least about 30 wt %, at least about 35 wt %, or at least about 40 wt %) to at most about 50 wt % (e.g., at most about 45 wt %, at most about 40 wt %, at most about 35 wt %, at most about 30 wt %, at most about 25 wt %, at most about 20 wt %, or at most about 15 wt %) of the etching composition. Without wishing to be bound by theory, it is believed that, if the amount of water is greater than 50 wt % of the composition, it would result in high etch rate of Si and SiOx, whose removal should be minimized during the etching process. On the other hand, without wishing to be bound by theory, it is believed that the etching composition of this disclosure should include a certain level of water (e.g., at least about 10 wt %) to keep all other components solubilized and to avoid reduction in the etching performance. In addition. without wishing to be bound by theory, it is believed that reducing the amount of water within the above ranges can significantly inhibit the removal of certain dielectric materials (e.g., boron doped SiGe) in the semiconductor substrate during the etching process.

In some embodiments, the etching composition of this disclosure can optionally further include at least one (e.g., two, three, or four) organic solvent. In some embodiments, the at least one organic solvent can include an ester, an alcohol, or an alkylene glycol ether. Examples of suitable organic solvents include propyl acetate, propylene glycol, hexylene glycol, 1,3-propanediol, ethylene glycol monobutyl ether (EGBE), and 3-methoxy-3-methyl-1-butanol. In some embodiments, the at least one organic solvent can be from at least about 10 wt % (e.g., at least about 15 wt %, at least about 20 wt %, at least about 25 wt %, at least about 30 wt %, or at least about 35 wt %) to at most about 40 wt % (e.g., at most about 35 wt %, at most about 30 wt %, at most about 25 wt %, at most about 20 wt %, or at most about 15 wt %) of the etching composition.

In embodiments when the etching composition of this disclosure includes a glycol, the catalyst can be optional (i.e., either included or omitted in the etching composition). Examples of suitable glycols include propylene glycol, hexylene glycol, and ethylene glycol monobutyl ether (EGBE). Without wishing to be bound by theory, it is believed that including a glycol in the etching composition of this disclosure can inhibit the etch rate of certain dielectric materials (such as SiOx).

In some embodiments, the etching composition of this disclosure can optionally further include at least one (e.g., two, three, or four) polyamine (e.g., polyethylenimine). In some embodiments, the at least one polyamine can be from at least about 0.001 wt % (e.g., at least about 0.002 wt %, at least about 0.005 wt %, at least about 0.01 wt %, at least about 0.02 wt %, at least about 0.04 wt %, or at least about 0.05 wt %) to at most about 0.5 wt % (e.g., at most about 0.4 wt %, at most about 0.3 wt %, at most about 0.2 wt %, at most about 0.1 wt %, at most about 0.08 wt %, at most about 0.06 wt %, or at most about 0.05 wt %) of the etching composition. Without wishing to be bound by theory, it is believed that including a polyamine in the etching composition of this disclosure can inhibit the etch rate of SiGe doped with boron.

In some embodiments, the etching composition of this disclosure can optionally further include at least one (e.g., two, three, or four) silane (e.g., 3-aminopropyl triethoxysilane). In some embodiments, the at least one silane comprises a silane of formula (III):

$$\text{Si}—R_4R_5R_6R_7 \qquad (III),$$

in which each of $R_4$, $R_5$, $R_6$, and $R_7$, independently, is $N(RR')$, $RC(O)O$, $C_1$-$C_8$ alkoxy (e.g., methoxy or ethyoxy), $C_1$-$C_{18}$ alkyl (e.g., methyl, butyl, hexyl, octyl, dodecyl, or octadecyl) optionally substituted by $N(RR')$ or $Si(R_aR_bR_c)$. Each of R and R', independently, is $C_1$-$C_{10}$ alkyl and each of $R_a$, $R_b$, and $R_c$, independently, is $C_1$-$C_{10}$ alkyl or $C_1$-$C_{10}$ alkoxy. Examples of suitable silanes include 3-aminopropyl triethoxysilane, methyltrimethoxysilane, dimethylaminotrimethylsilane, acetoxytrimethylsilane, octyltrimethoxysilane, butyltrimethoxysilane, dodecyltrimethoxysilane, hexyltrimethoxysilane, octadecyltrimethoxysilane, or bis(trimethoxysilyl)methane.

In some embodiments, the at least one silane can be from at least about 0.001 wt % (e.g., at least about 0.002 wt %, at least about 0.005 wt %, at least about 0.01 wt %, at least about 0.02 wt %, at least about 0.04 wt %, or at least about 0.05 wt %) to at most about 0.5 wt % (e.g., at most about 0.4 wt %, at most about 0.3 wt %, at most about 0.2 wt %, at most about 0.1 wt %, at most about 0.08 wt %, at most about 0.06 wt %, or at most about 0.05 wt %) of the etching composition. Without wishing to be bound by theory, it is believed that including a silane in the etching composition of this disclosure can inhibit the etch rate of SiGe doped with boron.

In some embodiments, the etching composition of this disclosure can optionally further include at least one (e.g., two, three, or four) sugar alcohol (e.g., mannitol or sorbitol). In some embodiments, the at least one sugar alcohol can be from at least about 0.001 wt % (e.g., at least about 0.002 wt %, at least about 0.005 wt %, at least about 0.01 wt %, at least about 0.02 wt %, or at least about 0.05 wt %) to at most about 0.1 wt % (e.g., at most about 0.08 wt %, at most about 0.06 wt %, at most about 0.05 wt %, at most about 0.04 wt %, at most about 0.02 wt %, or at most about 0.01 wt %) of the etching composition. Without wishing to be bound by theory, it is believed that including a sugar alcohol in the etching composition of this disclosure can inhibit the polysilicon etch rate.

In some embodiments, the etching composition of this disclosure can optionally further include at least one (e.g., two, three, or four) boronic acid. For example, the boronic acid can be of the following formula: $R—B(OH)_2$, in which R is $C_1$-$C_{10}$ alkyl, aryl, or heteroaryl where aryl or heteroaryl can be optionally substituted by one to six (e.g., 1, 2, 3, 4, 5, or 6) $C_1$-$C_{10}$ alkyl. Examples of suitable boronic acids include phenyl boronic acid and naphthalene-1-boronic acid.

In some embodiments, the at least one boronic acid can be from at least about 0.01 wt % (e.g., at least about 0.02 wt %, at least about 0.05 wt %, at least about 0.1 wt %, at least about 0.2 wt %, or at least about 0.3 wt %) to at most about 0.5 wt % (e.g., at most about 0.4 wt %, at most about 0.3 wt %, at most about 0.2 wt %, at most about 0.1 wt %, at most about 0.08 wt %, or at most about 0.05 wt %) of the etching composition. Without wishing to be bound by theory, it is believed that including a boronic acid in the etching composition of this disclosure can inhibit the SiOx etch rate.

In some embodiments, the etching composition of this disclosure can have a pH of at least about 0 (e.g., at least about 0.2, at least about 0.4, at least about 0.5, at least about 0.6, at least about 0.8, at least about 1, at least about 1.2, at least about 1.4, at least about 1.5, at least about 1.6, at least about 1.8, at least about 2, at least about 2.2, at least about 2.4, or at least about 2.5) and/or at most about 3 (e.g., at most about 2.8, at most about 2.6, at most about 2.5, at most about 2.4, at most about 2.2, at most about 2, or at most about 1.5). Without wishing to be bound by theory, it is believed that an etching composition having a pH higher than 3 would not have sufficient SiGe selectivity relative to low-k dielectric materials (e.g., SiOx) as such an etching composition may have a significantly increased low-k dielectric material etch rate. Further, it is believed that an etching composition having a pH lower than 0 could decompose certain components in the composition due to strong acidity.

In addition, in some embodiments, the etching composition of the present disclosure may contain additives such as, pH adjusting agents, corrosion inhibitors, surfactants, additional organic solvents, biocides, and defoaming agents as optional components. Examples of suitable additives include alcohols (e.g., polyvinyl alcohol), organic acids (e.g., iminodiacetic acid, malonic acid, oxalic acid, succinic acid, and malic acid), and inorganic acids (e.g., boric acid). Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference). Examples of suitable surfactants may be cationic, anionic, nonionic or amphoteric.

In general, the etching composition of the present disclosure can have a relatively high SiGe/dielectric material (e.g., boron doped SiGe (SiGe:B), SiN, polysilicon, or SiCO) etch selectivity (i.e., a high ratio of SiGe etch rate over dielectric material etch rate). In some embodiments, the etching composition can have a SiGe/dielectric material (e.g., SiGe/SiGe:B) etch selectivity of at least about 2 (e.g., at least about 3, at least about 4, at least about 5, at least about 6, at least about 7, at least about 8, at least about 9, at least about 10, at least about 15, at least about 20, at least about 30, at least about 40, or at least about 50) and/or at most about 500 (e.g., at most about 100).

In some embodiments, the etching compositions of the present disclosure may specifically exclude one or more of the additive components, in any combination, if more than one. Such components are selected from the group consisting of polymers, oxygen scavengers, quaternary ammonium compounds (including quaternary ammonium hydroxides (such as TMAH) and salts thereof), amines, bases (such as alkaline bases (e.g., NaOH, KOH, and LiOH) and organic bases), surfactants, defoamers, fluoride containing compounds (e.g., $H_2PF_6$, $HBF_4$, $NH_4F$, and tetraalkylammonium fluoride), abrasives, silicates, hydroxycarboxylic acids containing more than two hydroxyl groups, carboxylic and polycarboxylic acids (e.g., those lacking amino groups), silanes (e.g., alkoxysilanes), cyclic compounds (e.g., azoles (such as diazoles, triazoles, or tetrazoles), triazines, and cyclic compounds containing at least two rings, such as substituted or unsubstituted naphthalenes, or substituted or unsubstituted biphenylethers), buffering agents, corrosion inhibitors (such as azole or non-azole corrosion inhibitors), guanidine, guanidine salts, pyrrolidone, polyvinyl pyrrolidone, metal salts (e.g., metal halides), and catalysts (e.g., metal-containing catalysts).

The etching composition of this disclosure can be prepared by simply mixing the components together, or may be prepared by blending two compositions in a kit. The first composition in the kit can be an aqueous solution of an oxidizing agent (e.g., $H_2O_2$). The second composition in the kit can contain the remaining components of the etching composition of this disclosure at predetermined ratios in a concentrated form such that the blending of the two compositions will yield a desired etching composition of the disclosure.

In some embodiments, the present disclosure features a method of etching a semiconductor substrate containing at least one SiGe film (e.g., a film containing SiGe). The method can include contacting a semiconductor substrate containing the at least one SiGe film with an etching composition of this disclosure to remove the SiGe film. The method can further include rinsing the semiconductor substrate with a rinse solvent after the contacting step and/or drying the semiconductor substrate after the rinsing step. In some embodiments, the method does not substantially remove a metal conductor (e.g., Cu) or a dielectric material (e.g., SiN, polysilicon, SiCO, or SiGe doped with boron) in the semiconductor substrate. For example, the method does not remove more than about 5% by weight (e.g., more than about 3% by weight or more than about 1% by weight) of a metal conductor or a dielectric material in the semiconductor substrate.

In some embodiments, the SiGe film in a semiconductor substrate can include at least about 10 at % (e.g., at least about 12 at %, at least about 14 at %, at least about 15 at %, at least about 16 at %, at least about 18 at %, or at least about 20 at %) Ge and/or at most about 65 at % (e.g., at most about 60 at %, at most about 55 at %, at most about 50 at %, at most about 45 at %, at most about 40 at %, at most about 35 at %, at most about 34 at %, at most about 32 at %, at most about 30 at %, at most about 28 at %, at most about 26 at %, at most about 25 at %, at most about 24 at %, at most about 22 at %, at most about 20 at %, at most about 18 at %, at most about 16 at %, or at most about 15 at %) Ge in the SiGe film. As used herein, "at %" refers to atomic percentage, which is equivalent to molar percentage. Without wishing to be bound by theory, it is believed that a SiGe film containing from about 10 at % to about 35 at % Ge can be more easily removed from a semiconductor substrate by an etching composition compared to a film containing more than 35 at % or less than 10 at % Ge.

In some embodiments, the etching method includes the steps of:
(A) providing a semiconductor substrate containing a SiGe film;
(B) contacting the semiconductor substrate with an etching composition described herein;
(C) rinsing the semiconductor substrate with one or more suitable rinse solvents; and
(D) optionally, drying the semiconductor substrate (e.g., by any suitable means that removes the rinse solvent and does not compromise the integrity of the semiconductor substrate).

The semiconductor substrates containing SiGe to be etched in this method can contain organic and organometallic residues, and a range of metal oxides, some or all of which may also be removed during the etching process.

Semiconductor substrates described herein (e.g., wafers) typically are constructed of silicon, silicon germanium, Group III-V compounds such as GaAs, or any combination thereof. The semiconductor substrates can additionally contain exposed integrated circuit structures such as interconnect features (e.g., metal lines and dielectric materials). Metals and metal alloys used for interconnect features include, but are not limited to, aluminum, aluminum alloyed with copper, copper, titanium, tantalum, cobalt, silicon, titanium nitride, tantalum nitride, and tungsten. The semiconductor substrates may also contain layers of interlayer dielectrics, polysilicon, silicon oxide, silicon nitride, silicon carbide, titanium oxide, and carbon doped silicon oxides.

A semiconductor substrate can be contacted with the etching composition by any suitable method, such as placing the etching composition into a tank and immersing and/or submerging the semiconductor substrate into the etching composition, spraying the etching composition onto the semiconductor substrate, streaming the etching composition onto the semiconductor substrate, or any combinations thereof.

The etching composition of the present disclosure can be effectively used up to a temperature of about 85° C. (e.g., from about 20° C. to about 80° C., from about 55° C. to about 65° C., or from about 60° C. to about 65° C.). The etch rates of SiGe increase with temperature in this range, thus the processes at a higher temperature can be run for shorter times. Conversely, lower etching temperatures typically require longer etching times.

Etching times can vary over a wide range depending on the particular etching method, thickness, and temperature employed. When etching in an immersion batch type process, a suitable time range is, for example, up to about 10 minutes (e.g., from about 1 minute to about 7 minutes, from about 1 minute to about 5 minutes, or from about 2 minutes to about 4 minutes). Etching times for a single wafer process can range from about 30 seconds to about 5 minutes (e.g., from about 30 seconds to about 4 minutes, from about 1 minute to about 3 minutes, or from about 1 minute to about 2 minutes).

To further promote the etching ability of the etching composition of the present disclosure, mechanical agitation means can be employed. Examples of suitable agitation means include circulation of the etching composition over the substrate, streaming or spraying the etching composition over the substrate, and ultrasonic or megasonic agitation during the etching process. The orientation of the semiconductor substrate relative to the ground can be at any angle. Horizontal or vertical orientations are preferred.

Subsequent to the etching, the semiconductor substrate can be rinsed with a suitable rinse solvent for about 5 seconds up to about 5 minutes with or without agitation means. Multiple rinse steps employing different rinse solvents can be employed. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. Alternatively, or in addition, aqueous rinses with pH>8 (such as dilute aqueous ammonium hydroxide) can be employed. Examples of rinse solvents include, but are not limited to, dilute aqueous ammonium hydroxide, DI water, methanol, ethanol, and isopropyl alcohol. The rinse solvent can be applied using means similar to that used in applying an etching composition described herein. The etching composition may have been removed from the semiconductor substrate prior to the start of the rinsing step or it may still be in contact with the semiconductor substrate at the start of the rinsing step. In some embodiments, the temperature employed in the rinsing step is between 16° C. and 27° C.

Optionally, the semiconductor substrate is dried after the rinsing step. Any suitable drying means known in the art can be employed. Examples of suitable drying means include spin drying, flowing a dry gas across the semiconductor substrate, or heating the semiconductor substrate with a heating means such as a hotplate or infrared lamp, Maragoni drying, rotagoni drying, IPA drying or any combinations thereof. Drying times will be dependent on the specific method employed but are typically on the order of 30 seconds up to several minutes.

In some embodiments, the etching method described herein further includes forming a semiconductor device (e.g., an integrated circuit device such as a semiconductor chip) from the semiconductor substrate obtained by the method described above.

The present disclosure is illustrated in more detail with reference to the following examples, which are for illustrative purposes and should not be construed as limiting the scope of the present disclosure.

EXAMPLES

Any percentages listed are by weight (wt %) unless otherwise specified. Controlled stirring during testing was done with a 1 inch stirring bar at 250 rpm unless otherwise noted.

General Procedure 1

Formulation Blending

Samples of etching compositions were prepared by adding, while stirring, to the calculated amount of the solvent the remaining components of the formulation. After a uniform solution was achieved, optional additives, if used, were added.

General Procedure 2

Materials and Methods

Blanket film etch rate measurements on films were carried out using commercially available unpatterned 300 mm diameter wafers that were diced into 0.5"×1.0" test coupons for evaluation. Primary blanket film materials used for testing included 1) a SiGe film of about 500 Å thickness and containing 20 at % Ge deposited on a silicon substrate (SiGe20-1); 2) a boron doped SiGe film of about 250 Å thickness containing 25 at % Ge deposited on a silicon substrate (SiGe25:B); 3) a SiGe film of about 400 Å thickness and containing 30 at % Ge deposited on a silicon substrate (SiGe30-1); 4) a SiGe film of about 500 Å thickness and containing 20 at % Ge deposited on a silicon substrate (SiGe20-2); 5) a SiGe film of about 500 Å thickness and containing 25 at % Ge deposited on a silicon substrate (SiGe25); 6) a SiGe film of about 530 Å thickness and containing 30 at % Ge deposited on a silicon substrate (SiGe30-2); 7) a SiGe film of about 590 Å thickness and containing 50 at % Ge deposited on a silicon substrate (SiGe50); 8) a SiGe film of about 240 Å thickness and containing 65 at % Ge deposited on a silicon substrate (SiGe65), and 9) a SiOx film of about 1250 Å thickness deposited on a silicon substrate (SiOx).

The blanket film test coupons were measured for pre-treatment and post-treatment thickness to determine blanket film etch rates. The film thicknesses were measured pre-treatment and post-treatment by Ellipsometry using a Woollam VASE.

General Procedure 3

Etching Evaluation with Beaker Test

All blanket film etch testing was carried out at room temperature (21-23° C.) or specified controlled temperature in a 125 mL PFA bottle containing 100 g of a sample solution with continuous stirring at 250 rpm, with cap in place at all times to minimize evaporative losses. All blanket test coupons having a blanket dielectric film exposed on one side to the sample solution were diced by diamond scribe into 0.5"×1.0" square test coupon size for beaker scale testing. Each individual test coupon was held into position using a single 4" long, locking plastic tweezers clip. The test coupon, held on one edge by the locking tweezers clip, was suspended into the 125 mL PFA bottle and immersed into the 100 g test solution while the solution was stirred continuously at 250 rpm at room temperature (or specified controlled temp). The test coupons were held static in the stirred solution until the treatment time (as described in General Procedure 3A) had elapsed. After the treatment time in the test solution had elapsed, the sample coupons were immediately removed from the 125 mL PFA bottle and rinsed according to General Procedure 3A. After the final IPA rinse step, all test coupons were subject to a filtered nitrogen gas blow off step using a hand held nitrogen gas blower which forcefully removed all traces of IPA to produce a final dry sample for test measurements.

General Procedure 3A (Blanket Test Coupons)

Immediately after a treatment time of 2 to 10 minutes according to General Procedure 3, the coupon was immersed in a 300 mL volume of ultra-high purity deionized (DI) water for 15 seconds with mild agitation, which was followed by 300 mL of isopropyl alcohol (IPA) for 15 seconds with mild agitation, and a final rinse in 300 mL of IPA for 15 seconds with mild agitation. The processing was completed according to General Procedure 3.

Example 1

Formulation Examples 1-31 (FE-1 to FE-31) were prepared according to General Procedure 1. The formulations are summarized in Table 1.

TABLE 1

| Comp. [wt %] | HF | $H_2O_2$ | Organic acid or anhydride | Takesurf A-47Q | APDA | $H_2SO_4$ | Pyridine compound | Additive | Solvent | $H_2O$ | Total |
|---|---|---|---|---|---|---|---|---|---|---|---|
| FE-1 | 0.3% | 8.5% | 45% AA | 0.01% | 0.01% | 0.5% | 0.1% 2-PA | 0% | 24.29% PG | 21.29% | 100% |
| FE-2 | 0.3% | 8.5% | 45% AA | 0.01% | 0.01% | 0.5% | 0.1% DPA | 0% | 24.29% PG | 21.29% | 100% |
| FE-3 | 0.3% | 8.5% | 45% AA | 0.01% | 0.01% | 0.5% | 0.1% NA | 0% | 24.29% PG | 21.29% | 100% |
| FE-4 | 0.3% | 8.5% | 45% AA | 0.01% | 0.01% | 0.5% | 0.1% INA | 0% | 24.29% PG | 21.29% | 100% |
| FE-5 | 0.3% | 8.5% | 45% AA | 0.02% | 0.02% | 0.5% | 0.05% 2-PA | 0% | 20% PG | 25.61% | 100% |
| FE-6 | 0.3% | 8.5% | 45% AA | 0.02% | 0.02% | 0.5% | 0.05% INA | 0% | 20% PG | 25.61% | 100% |
| FE-7 | 0.3% | 8.5% | 45% AA | 0.01% | 0.01% | 0.5% | 0.05% INA | 0% | 20% PG | 25.63% | 100% |
| FE-8 | 0.3% | 8.5% | 48.88% AA | 0.01% | 0.01% | 0.9% | 0.1% 2-AINA | 0% | 20% PG | 21.3% | 100% |
| FE-9 | 0.3% | 8.5% | 48.88% AA | 0.01% | 0.01% | 0.9% | 0.1% INA-NO | 0% | 20% PG | 21.3% | 100% |
| FE-10 | 0.3% | 8.5% | 48.88% AA | 0.01% | 0.01% | 0.9% | 0.1% 4-PAA HCl | 0% | 20% PG | 21.3% | 100% |
| FE-11 | 0.32% | 8.96% | 47.37% AA | 0.01% | 0.01% | 0.9% | 0.05% 4-PAA HCl | 0% | 20% PG | 22.39% | 100% |
| FE-12 | 0.32% | 8.96% | 47.37% AA | 0.01% | 0.01% | 0.9% | 0.1% 4-PAA HCl | 0% | 20% PG | 22.33% | 100% |
| FE-13 | 0.32% | 8.96% | 47.37% AA | 0.01% | 0.01% | 0.9% | 0.1% 4-PAA HCl | 0.1% PEI | 20% PG | 22.23% | 100% |
| FE-14 | 0.32% | 8.96% | 47.37% AA | 0.01% | 0.01% | 0.9% | 0.1% 4-PAA HCl | 0.04% PEI | 20% PG | 22.29% | 100% |
| FE-15 | 0.32% | 8.5% | 48.91% AA | 0.01% | 0.01% | 0.9% | 0.05% 3-PAA HCl | 0% | 20% PG | 21.31% | 100% |
| FE-16 | 0.3% | 8.5% | 48.91% AA | 0.01% | 0.01% | 0.9% | 0.05% 2-PAA HCl | 0% | 20% PG | 21.31% | 100% |
| FE-17 | 0.3% | 8.5% | 48.91% AA | 0.01% | 0.01% | 0.9% | 0.05% 4-PP | 0% | 20% PG | 21.31% | 100% |
| FE-18 | 0.3% | 8.5% | 48.91% AA | 0.01% | 0.01% | 0.9% | 0.05% 3-PP | 0% | 20% PG | 21.31% | 100% |
| FE-19 | 0.3% | 8.5% | 45% AA | 0.01% | 0.01% | 0.5% | 0.05% 3-PP | 0% | 24.34% PG | 21.29% | 100% |
| FE-20 | 0.32% | 8.97% | 47.55% AA | 0.01% | 0.01% | 0.72% | 0.05% 3-PP | 0.1% 3-APTES | 19.86% PA | 22.41% | 100% |
| FE-21 | 0.2% | 8.5% | 68.81% AA | 0.01% | 0.01% | 0.9% | 0.3% 2-PA 0.05% 3-PP | 0% | 0% | 21.27% | 100% |
| FE-22 | 0.3% | 8.5% | 48.81% AA | 0.01% | 0.01% | 0.9% | 0.05% 4-PAA HCl 0.1% 3-PP | 0% | 20% | 21.31% | 100% |
| FE-23 | 0.3% | 8.5% | 45% AA 5% AA anhydride | 0.01% | 0.01% | 0.9% | 0.05% 3-PP | 0% | 20% | 20.23% | 100% |
| FE-24 | 0.2% | 8.5% | 68.81% AA | 0.01% | 0.01% | 0.9% | 0.3% 2-PA | 0% | 0% | 21.27% | 100% |
| FE-25 | 0.15% | 8.5% | 68.91% AA | 0.01% | 0.01% | 0.9% | 0.3% DPA | 0% | 0% | 21.22% | 100% |
| FE-26 | 0.3% | 8.5% | 53.86% AA | 0.01% | 0.01% | 0.7% | 0.3% 2-PA | 0% | 15% PG | 21.32% | 100% |
| FE-27 | 0.25% | 8.5% | 53.96% AA | 0.01% | 0.01% | 0.7% | 0.3% DPA | 0% | 15% PG | 21.27% | 100% |
| FE-28 | 0.3% | 8.5% | 45% AA | 0.01% | 0.01% | 0.7% | 0.1% 2-MP | 0% | 24.08% PG | 21.3% | 100% |
| FE-29 | 0.3% | 8.5% | 45% AA | 0.01% | 0.01% | 0.7% | 0.4% 2-MP | 0% | 24.11% PG | 20.97% | 100% |

TABLE 1-continued

| Comp. [wt %] | HF | $H_2O_2$ | Organic acid or anhydride | Takesurf A-47Q | APDA | $H_2SO_4$ | Pyridine compound | Additive | Solvent | $H_2O$ | Total |
|---|---|---|---|---|---|---|---|---|---|---|---|
| FE-30 | 0.3% | 8.5% | 45% AA | 0.01% | 0.01% | 0.7% | 0.025% 2-MP | 0% | 24.08% PG | 21.375% | 100% |
| FE-31 | 0.3% | 8.5% | 45% AA | 0.01% | 0.01% | 0.7% | 0.05% 2-MP | 0% | 24.08% PG | 21.35% | 100% |

APDA = N-(3-aminopropyl)-diethanolamine
AA = Acetic acid
PEI = Polyethyleneimine
PG = Propylene Glycol
2-PA = 2-Picolinic acid
DPA = Dipicolinic acid
NA = Nicotinic acid
INA = isonicotinic acid
2-AINA = 2-Amino-isonicotinic acid
INA-NO = isonicotinic acid N-oxide
4-PAA HCl = 4-Pyridylacetic acid HCl salt
3-PAA HCl = 3-Pyridylacetic acid HCl salt
2-PAA HCl = 2-Pyridylacetic acid HCl salt
4-PP = 4-Pyridinepropanol
3-PP = 3-Pyridinepropanol
PA = Propyl acetate
3-APTES = 3-Aminopropyl triethoxysilane
2-MP = 2-Methylpyridine Formulation Examples 1-31 (FE-1 to FE-31) were evaluated for their etch rates against blanket wafers having a SiGe film containing 20 at % Ge (SiGe20-1) and blanket wafers have a boron doped SiGe film containing 25 at % Ge (SiGe25:B) according to General Procedures 2 and 3A. The SiGe film was etched for one minute at 25° C., and the boron doped SiGe film was etched for two minutes at 25° C. The evaluation results are summarized in Table 2.

TABLE 2

| | SiGe20-1 ER (Å/min) | SiGe25:B ER (Å/min) | SiGe20/SiGe25:B ER ratio |
|---|---|---|---|
| FE-1 | 126.5 | 20.8 | 6.08 |
| FE-2 | 100.4 | 20 | 5.03 |
| FE-3 | 109.7 | 21.5 | 5.11 |
| FE-4 | 107.8 | 17.5 | 6.17 |
| FE-5 | 134.2 | 26.8 | 5.01 |
| FE-6 | 134.4 | 22.2 | 6.07 |
| FE-7 | 123.5 | 23.4 | 5.29 |
| FE-8 | 86.1 | 23.9 | 3.6 |
| FE-9 | 89.4 | 22.5 | 3.97 |
| FE-10 | 77.1 | 15.8 | 4.87 |
| FE-11 | 131 | 26.8 | 4.88 |
| FE-12 | 115.6 | 23.5 | 4.92 |
| FE-13 | 134.1 | 12.5 | 10.74 |
| FE-14 | 130 | 11.5 | 11.35 |
| FE-15 | 79 | 17.7 | 4.46 |
| FE-16 | 110.5 | 23.5 | 4.71 |
| FE-17 | 118.2 | 20.3 | 5.81 |
| FE-18 | 122.9 | 16 | 7.68 |
| FE-19 | 107.8 | 19.8 | 5.45 |
| FE-20 | 134.8 | 38.4 | 3.51 |
| FE-21 | 130.6 | 31.3 | 4.18 |
| FE-22 | 128.4 | 28.1 | 4.57 |
| FE-23 | 140.9 | 35.1 | 4.02 |
| FE-24 | 130.5 | 28.7 | 4.55 |
| FE-25 | 98.1 | 19 | 5.17 |
| FE-26 | 122.9 | 28.5 | 4.32 |
| FE-27 | 87.4 | 20.3 | 4.3 |
| FE-28 | 105.4 | 19.7 | 5.4 |
| FE-29 | 116.6 | 29.4 | 4 |
| FE-30 | 115.8 | 26.3 | 4.4 |
| FE-31 | 121.8 | 22.5 | 5.4 |

ER = Etch rate

As shown in Table 2, FE-1 to FE-31 all exhibited relatively high SiGe20/SiGe25:B etch selectivity. In other words, these formulations could effectively remove the SiGe film while minimizing the removal of exposed boron doped SiGe on a semiconductor substrate during the etching process.

Comparative Formulation Examples 1-6 (CFE-1 to CFE-6) were prepared according to General Procedure 1. The formulations are summarized in Table 3.

TABLE 3

| Comp. [wt %] | HF | $H_2O_2$ | Acetic acid | Takesurf A-47Q | APDA | Additive | Solvent | $H_2O$ | Total |
|---|---|---|---|---|---|---|---|---|---|
| CFE-1 | 0.3% | 8.5% | 45% | 0% | 0.01% | 0% | 24.91% PGDA | 21.28% | 100% |
| CFE-2 | 0.3% | 8.5% | 45% | 0% | 0.01% | 0.01% PSSA | 24.91% PGDA | 21.27% | 100% |
| CFE-3 | 0.3% | 8.5% | 45% | 0.01% | 0.01% | 0.02% PEG8000 | 24.86% PGDA | 21.3% | 100% |
| CFE-4 | 0.3% | 8.5% | 55% | 0.01% | 0.01% | 0.02% PEG8000 | 14.86% PGDA | 21.3% | 100% |

TABLE 3-continued

| Comp. [wt %] | HF | H₂O₂ | Acetic acid | Takesurf A-47Q | APDA | Additive | Solvent | H₂O | Total |
|---|---|---|---|---|---|---|---|---|---|
| CFE-5 | 0.4% | 8.5% | 54.6% | 0.01% | 0.01% | 0.05% PBA 0.02% PEG8000 | 10% PG 5% PGDA | 21.41% | 100% |
| CFE-6 | 0.3% | 8.5% | 45% | 0.01% | 0.01% | 0.9% PHA | 23.85% PG | 21.42% | 100% |

PBA = Phenyl boronic acid
PGDA = Propylene glycol diacetate
PSSA = Poly (4-styrene sulfonic acid)
PHA = Phosphoric acid
PEG8000 = Polyethylene glycol (MW = 8000)

Comparative Formulation Examples 1-6 (CFE-1 to CFE-6) were evaluated for their etch rates against blanket wafers containing a SiGe20-1 film and blanket wafers containing a SiGe25:B film according to General Procedures 2 and 3A. The SiGe film was etched for one minute at 25° C., and the boron doped SiGe film was etched for two minutes at 25° C. The evaluation results are summarized in Table 4.

TABLE 4

| | SiGe20 ER (Å/min) | SiGe25:B ER (Å/min) | SiGe20/SiGe25:B ER ratio |
|---|---|---|---|
| CFE-1 | 139.7 | 63.4 | 2.2 |
| CFE-2 | 128.4 | 61.3 | 2.1 |
| CFE-3 | 123.8 | 54.4 | 2.3 |
| CFE-4 | 122.1 | 51.1 | 2.4 |
| CFE-5 | 111.2 | 48.9 | 2.3 |
| CFE-6 | 165.9 | >115 | <1.4 |

As shown in Table 3, CFE-1 to CFE-6 included no sulfuric acid or pyridine containing compounds, and CFE-1 and CFE-2 also did not include Takesurf A-47Q. As a result, Table 4 shows that these formulations exhibited a relatively high SiGe25:B etch rate and a relatively low SiGe20/SiGe25:B etch rate selectivity.

Example 2

Formulation Examples 32-42 (FE-32 to FE-42) were prepared according to General Procedure 1. The formulations are summarized in Table 5.

TABLE 5

| Comp. [wt %] | HF | H₂O₂ | Acetic acid | Takesurf A-47Q | APDA | H₂SO₄ | H₂O | Total |
|---|---|---|---|---|---|---|---|---|
| FE-32 | 0.2% | 8.5% | 69.24% | 0.01% | 0.01% | 0.9% | 21.14% | 100% |
| FE-33 | 0.3% | 10.3% | 63.09% | 0.01% | 0.01% | 0.9% | 25.39% | 100% |
| FE-34 | 0.33% | 11% | 60.71% | 0.01% | 0.01% | 0.9% | 27.04% | 100% |
| FE-35 | 0.23% | 9.39% | 63.33% | 0.01% | 0.01% | 0.9% | 26.13% | 100% |
| FE-36 | 0.4% | 10.47% | 62.36% | 0.01% | 0.01% | 0.9% | 25.85% | 100% |
| FE-37 | 0.37% | 8.8% | 67.97% | 0.01% | 0.01% | 0.9% | 21.94% | 100% |
| FE-38 | 0.1% | 9.72% | 65.36% | 0.01% | 0.01% | 0.9% | 23.90% | 100% |
| FE-39 | 0.2% | 8.21% | 70.21% | 0.01% | 0.01% | 0.9% | 20.46% | 100% |
| FE-40 | 0.13% | 7.89% | 67.99% | 0.01% | 0.01% | 0.9% | 23.07% | 100% |
| FE-41 | 0.17% | 7.65% | 72.13% | 0.01% | 0.01% | 0.9% | 19.13% | 100% |
| FE-42 | 0.27% | 6% | 77.45% | 0.01% | 0.01% | 0.9% | 15.36% | 100% |

Formulation Examples 32-42 (FE-32 to FE-42) were evaluated for their etch rates against blanket wafers having a SiGe film containing 30 at % Ge (SiGe30-1) and blanket wafers containing a SiOx film according to General Procedures 2 and 3A. The SiGe30 film was etched for one minute at 25° C., and the SiOx film was etched for two minutes at 25° C. FE-32 and FE-38 were also evaluated for their etch rates against SiGe25:B (2 minutes at 25° C.), SiGe20-2 (1 minute at 25° C.), SiGe25 (1 minute at 25° C.), SiGe30-2 (1 minute at 25° C.), SiGe50 (1 minute at 25° C.), and SiGe65 (15 seconds at 25° C.). The evaluation results are summarized in Table 6.

TABLE 6

| | SiGe30-1 ER (Å/min) | SiOx ER (Å/min) | SiGe25:B ER (Å/min) | SiGe20-2 ER (Å/min) | SiGe25 ER (Å/min) | SiGe30-2 ER (Å/min) | SiGe50 ER (Å/min) | SiGe65 ER (Å/min) |
|---|---|---|---|---|---|---|---|---|
| FE-32 | 247.6 | 19.7 | 45.7 | 123.9 | 182.6 | 224 | 875.8 | 1401 |
| FE-33 | 385.5 | 39.6 | N/A | N/A | N/A | N/A | N/A | N/A |
| FE-34 | 390.6 | 47.6 | N/A | N/A | N/A | N/A | N/A | N/A |
| FE-35 | 294.2 | 26.6 | N/A | N/A | N/A | N/A | N/A | N/A |
| FE-36 | 457.2 | 59.3 | N/A | N/A | N/A | N/A | N/A | N/A |
| FE-37 | 304.1 | 45.8 | N/A | N/A | N/A | N/A | N/A | N/A |
| FE-38 | 156.3 | 7 | 14.8 | 67.4 | 84.1 | 186 | 349.8 | 421 |
| FE-39 | 248 | 21.5 | N/A | N/A | N/A | N/A | N/A | N/A |
| FE-40 | 198 | 10.7 | 31.1 | N/A | N/A | N/A | N/A | N/A |
| FE-41 | 224.6 | N/A | N/A | N/A | N/A | N/A | N/A | N/A |
| FE-42 | 265.6 | N/A | N/A | N/A | N/A | N/A | N/A | N/A |

N/A = not available

As shown in Table 6, FE-32 to FE-42 all exhibited relatively high SiGe30 etch rates even though they did not include any pyridine-containing compound. In addition, Table 6 demonstrates that formulations having a relatively low amount of HF (e.g., FE-38) would significantly reduce the SiOx etch rate, thereby inhibiting SiOx removal during the etching process. Further, the above results show that FE-32 and FE-38 exhibited an increased SiGe etch rate when the SiGe film contains an increased amount of Ge.

Example 3

Formulation Examples 43-55 (FE-43 to FE-55) were prepared according to General Procedure 1. The formulations are summarized in Table 7.

TABLE 7

| Comp. [wt %] | HF | $H_2O_2$ | Acetic acid | Takesurf A-47Q | APDA | $H_2SO_4$ | Silane | $H_2O$ | Total |
|---|---|---|---|---|---|---|---|---|---|
| FE-43 | 0.11% | 9.72% | 65.34% | 0.01% | 0.01% | 0.9% | 0.1% MTMS | 23.81% | 100% |
| FE-44 | 0.11% | 9.72% | 65.34% | 0.01% | 0.01% | 0.9% | 0.05% MTMS | 23.86% | 100% |
| FE-45 | 0.11% | 9.72% | 65.34% | 0.01% | 0.01% | 0.9% | 0.08% MTMS | 23.83% | 100% |
| FE-46 | 0.11% | 9.72% | 65.34% | 0.01% | 0.01% | 0.9% | 0.09% MTMS | 23.82% | 100% |
| FE-47 | 0.11% | 9.72% | 65.34% | 0.01% | 0.01% | 0.9% | 0.1% OTMS | 23.81% | 100% |
| FE-48 | 0.11% | 9.72% | 65.34% | 0.01% | 0.01% | 0.9% | 0.1% BTMS | 23.81% | 100% |
| FE-49 | 0.11% | 9.72% | 65.34% | 0.01% | 0.01% | 0.9% | 0.1% DDTMS | 23.81% | 100% |
| FE-50 | 0.11% | 9.72% | 65.34% | 0.01% | 0.01% | 0.9% | 0.1% HTMS | 23.81% | 100% |
| FE-51 | 0.11% | 9.72% | 65.34% | 0.01% | 0.01% | 0.9% | 0.1% ODTMS | 23.81% | 100% |
| FE-52 | 0.11% | 9.72% | 65.34% | 0.01% | 0.01% | 0.9% | 0.1% BTMSM | 23.81% | 100% |
| FE-53 | 0.12% | 9.72% | 65.33% | 0.01% | 0.01% | 0.9% | 0.1% MTMS | 23.81% | 100% |

TABLE 7-continued

| Comp. [wt %] | HF | H₂O₂ | Acetic acid | Takesurf A-47Q | APDA | H₂SO₄ | Silane | H₂O | Total |
|---|---|---|---|---|---|---|---|---|---|
| FE-54 | 0.11% | 9.72% | 65.34% | 0.01% | 0.01% | 0.9% | 0.1% DMATMS | 23.81% | 100% |
| FE-55 | 0.11% | 9.72% | 65.34% | 0.01% | 0.01% | 0.9% | 0.1% ATMS | 23.81% | 100% |

MTMS = Methyltrimethoxysilane;
DMATMS = Dimethylaminotrimethylsilane
ATMS = Acetoxytrimethylsilane
OTMS = Octyltrimethoxysilane
BTMS = Butyltrimethoxysilane
DDTMS = Dodecyltrimethoxysilane
HTMS = Hexyltrimethoxysilane
ODTMS = Octadecyltrimethoxysilane
BTMSM = Bis(trimethoxysilyl)methane Formulation Examples 43-44 (FE-43 to FE-44) were evaluated for their etch rates against blanket wafers having a SiGe film containing 20 at % Ge (SiGe20-1) and blanket wafers have a boron doped SiGe film containing 25 at % Ge (SiGe25:B) according to General Procedures 2 and 3A. The SiGe20 film was etched for one minute at 25° C., and the SiGe25:B film was etched for two minutes at 25° C. The evaluation results are summarized in Table 8.

TABLE 8

| | SiGe20-1 ER (Å/min) | SiGe25:B ER (Å/min) | SiGe20/SiGe25:B ER ratio |
|---|---|---|---|
| FE-43 | 44.2 | 0.2 | 221 |
| FE-44 | 83.4 | 7.7 | 10.8 |
| FE-45 | 69.7 | 3.6 | 19.4 |
| FE-46 | 68.6 | 5.1 | 13.5 |
| FE-47 | 53.6 | 2.5 | 21.4 |
| FE-48 | 43.8 | 0.2 | 219 |
| FE-49 | 80.2 | 7.1 | 11.3 |
| FE-50 | 49.7 | 0.4 | 124.3 |

TABLE 8-continued

| | SiGe20-1 ER (Å/min) | SiGe25:B ER (Å/min) | SiGe20/SiGe25:B ER ratio |
|---|---|---|---|
| FE-51 | Not measureable | 1.6 | N/A |
| FE-52 | 36.2 | 0 | N/A |
| FE-53 | 65.1 | 3.3 | 19.7 |
| FE-54 | 73.8 | 5.7 | 12.9 |
| FE-55 | 103.4 | 12.7 | 8.14 |

As shown in Table 8, FE-43 to FE-50 and FR-52 to FE-55 (which included a silane) exhibited relatively low SiGe25:B etch rates and relatively high SiGe20/SiGe25:B etch selectivity. In other words, these formulations could effectively remove the SiGe film while minimizing the removal of exposed boron doped SiGe on a semiconductor substrate during the etching process.

Example 4

Formulation Examples 56 and 57 (FE-56 and FE-57) were prepared according to General Procedure 1. The formulations are summarized in Table 9.

TABLE 9

| Comp. [wt %] | HF | H₂O₂ | Acetic acid | Takesurf A-47Q | APDA | H₂SO₄ | Acetic Anhydride | H₂O | Total |
|---|---|---|---|---|---|---|---|---|---|
| FE-56 | 0.0798% | 7.05% | 54.05% | 0.01% | 0.01% | 0.65% | 27.5% | 10.6502% | 100% |
| FE-57 | 0.0653% | 7.05% | 54.06% | 0.01% | 0.01% | 0.9% | 27.5% | 10.4047% | 100% |

Formulation Examples 56 and 57 (FE-56 to FE-57) were evaluated for their etch rates against blanket wafers containing the following films according to General Procedures 2 and 3A: SiOx (2 minutes at 25° C.), SiGe25:B (2 minutes at 25° C.), SiGe20-2 (1 minute at 25° C.), SiGe 25 (1 minute at 25° C.), SiGe30-2 (1 minute at 25° C.), SiGe50 (1 minute at 25° C.), and SiGe65 (15 seconds at 25° C.). The evaluation results are summarized in Table 10.

TABLE 10

| | SiOx ER (Å/min) | SiGe25:B ER (Å/min) | SiGe20-2 ER (Å/min) | SiGe25 ER (Å/min) | SiGe30-2 ER (Å/min) | SiGe50 ER (Å/min) | SiGe65 ER (Å/min) |
|---|---|---|---|---|---|---|---|
| FE-56 | 1.4 | 8.9 | 56.4 | 67.9 | 153.8 | 254.2 | 350.8 |
| FE-57 | 1.3 | 1.8 | 48.8 | 54.1 | 112.3 | 172.2 | 331.8 |

As shown in Table 10, by reducing the amount of HF and water, FE-56 and FE-57 all exhibited relatively low SiOx and SiGe25:B etch rates, thereby inhibiting SiOx and SiGE25:B removal during the etching process. Further, the above results show that FE-56 and FE-57 exhibited relatively good SiGe/SiGe25:B etch selectivity.

Example 5

Formulation Examples 58 and 59 (FE-58 and FE-59) were prepared according to General Procedure 1. The formulations are summarized in Table 11.

TABLE 11

| Comp. [wt %] | HF | $H_2O_2$ | Acetic acid | Takesurf A-47Q | APDA | MSA | 3-MP | PG | $H_2O$ | Total |
|---|---|---|---|---|---|---|---|---|---|---|
| FE-58 | 0.3% | 8.5% | 45% | 0.01% | 0.01% | 0% | 0.1% | 24.81% | 21.27% | 100% |
| FE-59 | 0.3% | 8.5% | 45% | 0.01% | 0.01% | 0.9% | 0.1% | 23.63% | 21.55% | 100% |

3-MP = 3-Methylpyridine

Formulation Examples 58 and 59 (FE-58 to FE-59) were evaluated for their etch rates against blanket wafers containing the following films according to General Procedures 2 and 3A: SiOx (2 minutes at 25° C.), SiGe20-1 (1 minute at 25° C.), and SiGe25:B (2 minutes at 25° C.). The evaluation results are summarized in Table 12.

TABLE 12

| | SiOx ER (Å/min) | SiGe20-1 ER (Å/min) | SiGe25:B ER (Å/min) | SiGe20/ SiGe25:B ER ratio |
|---|---|---|---|---|
| FE-58 | 9.8 | 92.1 | 20.2 | 4.6 |
| FE-59 | 14.7 | 131 | 32.9 | 4 |

As shown in Table 11, FE-58 did not include sulfuric acid, but included propylene glycol as an organic solvent, while FE-59 did not include sulfuric acid, but included methanesulfonic acid as a catalyst and propylene glycol as an organic solvent. Table 12 shows that both formulations exhibited relatively low SiOx etch rate and relatively high SiGe20/SiGe25:6 etch selectivity.

While the invention has been described in detail with reference to certain embodiments thereof, it will be understood that modifications and variations are within the spirit and scope of that which is described and claimed.

What is claimed is:

1. An etching composition, comprising:
   at least one fluorine-containing acid, the at least one fluorine-containing acid comprising hydrofluoric acid or hexafluorosilicic acid;
   at least one oxidizing agent;
   at least one catalyst comprising sulfuric acid, a sulfonic acid, or a phosphonic acid;
   at least one organic acid or an anhydride thereof, the at least one organic acid comprising formic acid, acetic acid, propionic acid, or butyric acid and the at least one organic acid or an anhydride thereof being in an amount of from about 30 wt % to about 90 wt % of the composition;
   at least one polymerized naphthalene sulfonic acid or a salt thereof; and
   at least one amine, the at least one amine comprising an amine of formula (I): N—$R_1R_2R_3$, wherein $R_1$ is $C_1$-$C_8$ alkyl optionally substituted by OH or $NH_2$, $R_2$ is H or $C_1$-$C_8$ alkyl optionally substituted by OH, and $R_3$ is $C_1$-$C_8$ alkyl optionally substituted by OH.

2. The composition of claim 1, wherein the at least one fluorine-containing acid is in an amount of from about 0.01 wt % to about 2 wt % of the composition.

3. The composition of claim 1, wherein the at least one oxidizing agent comprises hydrogen peroxide or peracetic acid.

4. The composition of claim 1, wherein the at least one oxidizing agent is in an amount of from about 5 wt % to about 20 wt % of the composition.

5. The composition of claim 1, wherein the at least one catalyst comprises sulfuric acid, methanesulfonic acid, phosphonic acid, or phenylphosphonic acid.

6. The composition of claim 1, wherein the at least one catalyst is in an amount of from about 0.1 wt % to about 5 wt % of the composition.

7. The composition of claim 1, wherein the at least one organic acid or an anhydride thereof comprises acetic acid or acetic anhydride.

8. The composition of claim 1, wherein the at least one organic acid or an anhydride thereof is in an amount of from about 30 wt % to about 85 wt % of the composition.

9. The composition of claim 1, wherein the at least one polymerized naphthalene sulfonic acid comprises a sulfonic acid having a structure of

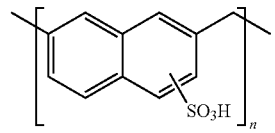

in which n is 3 to 6.

10. The composition of claim 1, wherein the at least one polymerized naphthalene sulfonic acid or a salt thereof is in an amount of from about 0.001 wt % to about 0.15 wt % of the composition.

11. The composition of claim 1, further comprising at least one pyridine containing compound, the at least one pyridine containing compound comprising pyridine optionally substituted by $C_1$-$C_6$ alkyl, a pyridine containing acid, a pyridine containing alcohol, or a salt thereof.

12. The composition of claim 11, wherein the at least one pyridine containing compound comprises picolinic acid, dipicolinic acid, nicotinic acid, isonicotinic acid, 2-aminoisonicotinic acid, isonicotinic acid N-oxide, 4-pyridylacetic acid, 3-pyridylacetic acid, 2-pyridylacetic acid, 4-pyridinepropanol, 3-pyridinepropanol, 2-methylpyridine, 3-methylpyridine, or a salt thereof.

13. The composition of claim 11, wherein the at least one pyridine containing compound is in an amount of from about 0.01 wt % to about 1 wt % of the composition.

14. The composition of claim 1, wherein the amine of formula (I) is diisopropylamine, N-butyldiethanolamine, N-(3-aminopropyl)-diethanolamine, N-octylglucamine, N-ethylglucamine, N-methylglucamine, or 1-[bis(2-hydroxyethyl)amino]-2-propanol.

15. The composition of claim 1, wherein the at least one amine is in an amount of from about 0.001 wt % to about 0.15 wt % of the composition.

16. The composition of claim 1, further comprising at least one organic solvent.

17. The composition of claim 16, wherein the at least one organic solvent comprises an ester, an alcohol, or an alkylene glycol ether.

18. The composition of claim 16, wherein the at least one organic solvent comprises propyl acetate, propylene glycol, hexylene glycol, 1,3-propanediol, or ethylene glycol butyl ether.

19. The composition of claim 16, wherein the at least one organic solvent is in an amount of from about 10 wt % to about 40 wt % of the composition.

20. The composition of claim 1, further comprising water.

21. The composition of claim 20, wherein the water is in an amount of from about 10 wt % to about 50 wt % of the composition.

22. The composition of claim 1, further comprising at least one silane.

23. The composition of claim 22, wherein the at least one silane comprises a silane of formula (III):

in which each of $R_4$, $R_5$, $R_6$, and $R_7$, independently, is N(RR'), RC(O)O, $C_1$-$C_8$ alkoxy, $C_1$-$C_{18}$ alkyl optionally substituted by N(RR') Si($R_aR_bR_c$), wherein each of R and R', independently, is $C_1$-$C_{10}$ alkyl and each of $R_a$, $R_b$, and $R_c$, independently, is $C_1$-$C_{10}$ alkyl or $C_1$-$C_{10}$ alkoxy.

24. The composition of claim 23, wherein the at least one silane comprises 3-aminopropyl triethoxysilane, methyltrimethoxysilane, dimethylaminotrimethylsilane, acetoxytrimethylsilane, octyltrimethoxysilane, butyltrimethoxysilane, dodecyltrimethoxysilane, hexyltrimethoxysilane, octadecyltrimethoxysilane, or bis(trimethoxysilyl)methane.

25. The composition of claim 22, wherein the at least one silane is in an amount of from about 0.001 wt % to about 0.5 wt % of the composition.

26. The composition of claim 1, wherein the composition has a pH of from about 0 to about 3.

27. A method, comprising:
contacting a semiconductor substrate containing a SiGe film with the composition of claim 1 to substantially remove the SiGe film.

28. The method of claim 27, wherein the SiGe film comprises from about 10 at % to about 65 at % Ge.

29. The method of claim 27, further comprising rinsing the semiconductor substrate with a rinse solvent after the contacting step.

30. The method of claim 29, further comprising drying the semiconductor substrate after the rinsing step.

31. The method of claim 27, wherein the method does not substantially remove SiN, poly-Si, SiCO, or SiGe doped with boron.

32. An article formed by the method of claim 27, wherein the article is a semiconductor device.

33. The article of claim 32, wherein the semiconductor device is an integrated circuit.

34. The composition of claim 1, further comprising water.

35. The composition of claim 34, wherein the water is in an amount of from about 10 wt % to about 50 wt % of the composition.

36. The composition of claim 1, further comprising at least one boronic acid.

37. The composition of claim 36, wherein at least one boronic acid comprises phenyl boronic acid.

38. The composition of claim 36, wherein the at least one boronic acid is in an amount of from about 0.01 wt % to about 0.5 wt % of the composition.

39. The composition of claim 1, wherein:
the at least one fluorine-containing acid is in an amount of from about 0.01 wt % to about 2 wt % of the composition;
the at least one oxidizing agent is in an amount of from about 5 wt % to about 20 wt % of the composition;
the at least one catalyst is in an amount of from about 0.1 wt % to about 5 wt % of the composition;
the at least one organic acid or an anhydride thereof is in an amount of from about 40 wt % to about 90 wt % of the composition;
the at least one polymerized naphthalene sulfonic acid or a salt thereof is in an amount of from about 0.001 wt % to about 0.15 wt % of the composition; and
the at least one amine is in an amount of from about 0.001 wt % to about 0.15 wt % of the composition.

40. The composition of claim 39, further comprising at least one boronic acid in an amount of from about 0.01 wt % to about 0.5 wt % of the composition.

41. An etching composition, comprising:
at least one fluorine-containing acid, the at least one fluorine-containing acid comprising hydrofluoric acid or hexafluorosilicic acid;
at least one oxidizing agent;
at least one organic acid or an anhydride thereof, the at least one organic acid comprising formic acid, acetic acid, propionic acid, or butyric acid and the at least one organic acid or an anhydride thereof being in an amount of from about 30 wt % to about 90 wt % of the composition;
at least one polymerized naphthalene sulfonic acid or a salt thereof;
at least one amine, the at least one amine comprising an amine of formula (I): N—$R_1R_2R_3$, wherein $R_1$ is $C_1$-$C_8$ alkyl optionally substituted by OH or $NH_2$, $R_2$ is H or $C_1$-$C_8$ alkyl optionally substituted by OH, and $R_3$ is $C_1$-$C_8$ alkyl optionally substituted by OH; and
at least one glycol.

42. The composition of claim 41, wherein the at least one fluorine-containing acid is in an amount of from about 0.01 wt % to about 2 wt % of the composition.

43. The composition of claim 41, wherein the at least one oxidizing agent comprises hydrogen peroxide or peracetic acid.

44. The composition of claim 41, wherein the at least one oxidizing agent is in an amount of from about 5 wt % to about 20 wt % of the composition.

45. The composition of claim 41, further comprising at least one catalyst comprising sulfuric acid, a sulfonic acid, or a phosphonic acid.

46. The composition of claim 45, wherein the at least one catalyst comprises sulfuric acid, methanesulfonic acid, phosphonic acid, or phenylphosphonic acid.

47. The composition of claim 45, wherein the at least one catalyst is in an amount of from about 0.1 wt % to about 5 wt % of the composition.

48. The composition of claim 41, wherein the at least one organic acid or an anhydride thereof comprises acetic acid or acetic anhydride.

49. The composition of claim 41, wherein the at least one organic acid or an anhydride thereof is in an amount of from about 30 wt % to about 85 wt % of the composition.

50. The composition of claim 41, wherein the at least one polymerized naphthalene sulfonic acid comprises a sulfonic acid having a structure of

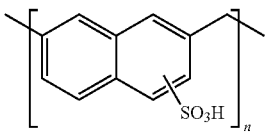

in which n is 3 to 6.

51. The composition of claim 41, wherein the at least one polymerized naphthalene sulfonic acid or a salt thereof is in an amount of from about 0.001 wt % to about 0.15 wt % of the composition.

52. The composition of claim 41, further comprising at least one pyridine containing compound, the at least one pyridine containing compound comprising pyridine optionally substituted by $C_1$-$C_6$ alkyl, a pyridine containing acid, a pyridine containing alcohol, or a salt thereof.

53. The composition of claim 52, wherein the at least one pyridine containing compound comprises picolinic acid, dipicolinic acid, nicotinic acid, isonicotinic acid, 2-amino-isonicotinic acid, isonicotinic acid N-oxide, 4-pyridylacetic acid, 3-pyridylacetic acid, 2-pyridylacetic acid, 4-pyridinepropanol, 3-pyridinepropanol, 2-methylpyridine, 3-methylpyridine, or a salt thereof.

54. The composition of claim 52, wherein the at least one pyridine containing compound is in an amount of from about 0.01 wt % to about 1 wt % of the composition.

55. The composition of claim 41, wherein the amine of formula (I) is diisopropylamine, N-butyldiethanolamine, N-(3-aminopropyl)-diethanolamine, N-octylglucamine, N-ethylglucamine, N-methylglucamine, or 1-[bis(2-hydroxyethyl)amino]-2-propanol.

56. The composition of claim 41, wherein the at least one amine is in an amount of from about 0.001 wt % to about 0.15 wt % of the composition.

57. The composition of claim 41, wherein the at least one glycol comprises propylene glycol, hexylene glycol, 1,3-propanediol, or ethylene glycol butyl ether.

58. The composition of claim 41, wherein the at least one glycol is in an amount of from about 10 wt % to about 40 wt % of the composition.

59. The composition of claim 41, further comprising at least one silane.

60. The composition of claim 59, wherein the at least one silane comprises a silane of formula (III):

$$\text{Si}-R_4R_5R_6R_7 \qquad (III),$$

in which each of $R_4$, $R_5$, $R_6$, and $R_7$, independently, is N(RR'), RC(O)O, $C_1$-$C_8$ alkoxy, $C_1$-$C_{18}$ alkyl optionally substituted by N(RR') Si($R_aR_bR_c$), wherein each of R and R', independently, is $C_1$-$C_{10}$ alkyl and each of $R_a$, $R_b$, and $R_c$, independently, is $C_1$-$C_{10}$ alkyl or $C_1$-$C_{10}$ alkoxy.

61. The composition of claim 60, wherein the at least one silane comprises 3-aminopropyl triethoxysilane, methyltrimethoxysilane, dimethylaminotrimethylsilane, acetoxytrimethyl silane, octyltrimethoxysilane, butyltrimethoxysilane, dodecyltrimethoxysilane, hexyltrimethoxysilane, octadecyltrimethoxysilane, or bis(trimethoxysilyl)methane.

62. The composition of claim 59, wherein the at least one silane is in an amount of from about 0.001 wt % to about 0.5 wt % of the composition.

63. The composition of claim 41, wherein the composition has a pH of from about 0 to about 3.

64. A method, comprising:
 contacting a semiconductor substrate containing a SiGe film with the composition of claim 41 to substantially remove the SiGe film.

65. The method of claim 64, wherein the SiGe film comprises from about 10 at % to about 65 at % Ge.

66. The method of claim 64, further comprising rinsing the semiconductor substrate with a rinse solvent after the contacting step.

67. The method of claim 66, further comprising drying the semiconductor substrate after the rinsing step.

68. The method of claim 64, wherein the method does not substantially remove SiN, poly-Si, SiCO, or SiGe doped with boron.

69. An article formed by the method of claim 64, wherein the article is a semiconductor device.

70. The article of claim 69, wherein the semiconductor device is an integrated circuit.

* * * * *

UNITED STATES PATENT AND TRADEMARK OFFICE
CERTIFICATE OF CORRECTION

| | | |
|---|---|---|
| PATENT NO. | : 11,820,929 B2 | Page 1 of 1 |
| APPLICATION NO. | : 17/466531 | |
| DATED | : November 21, 2023 | |
| INVENTOR(S) | : Mick Bjelopavlic and Carl Ballesteros | |

It is certified that error appears in the above-identified patent and that said Letters Patent is hereby corrected as shown below:

In the Claims

<u>Column 28</u>
Lines 17-18, in Claim 61, delete "acetoxytrimethyl silane," and insert -- acetoxytrimethylsilane, --

Signed and Sealed this
Third Day of September, 2024

Katherine Kelly Vidal
*Director of the United States Patent and Trademark Office*